(12) United States Patent
Bernacchia et al.

(10) Patent No.: US 10,693,454 B2
(45) Date of Patent: Jun. 23, 2020

(54) SIGNALS FOR THE CONTROL OF POWER DEVICES

(71) Applicant: Infineon Technologies Austria AG, Villach (AT)

(72) Inventors: Giuseppe Bernacchia, Villach (AT); David Grant Cox, Rosegg (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/988,509

(22) Filed: May 24, 2018

(65) Prior Publication Data

US 2019/0363709 A1 Nov. 28, 2019

(51) Int. Cl.
| | | |
|---|---|---|
| *H02P 6/00* | (2016.01) | |
| *H03K 17/56* | (2006.01) | |
| *H02M 1/08* | (2006.01) | |
| *H02P 27/04* | (2016.01) | |
| *H03K 4/92* | (2006.01) | |
| *H03K 7/08* | (2006.01) | |
| *B62D 5/04* | (2006.01) | |

(52) U.S. Cl.
CPC .............. *H03K 17/56* (2013.01); *H02M 1/08* (2013.01); *H02P 27/04* (2013.01); *H03K 4/92* (2013.01); *H03K 7/08* (2013.01); *B62D 5/046* (2013.01)

(58) Field of Classification Search
CPC . H02M 1/08; H02P 27/04; H03K 4/92; H03K 7/08; B62D 5/046
USPC ........................................ 318/400.26, 400.06
See application file for complete search history.

(56) References Cited

U.S. PATENT DOCUMENTS

| | | | | |
|---|---|---|---|---|
| 2015/0061555 A1* | 3/2015 | Hamasaki | ............... | B62D 5/046 318/400.06 |
| 2017/0294774 A1* | 10/2017 | Illing | .................... | H02H 6/005 |

OTHER PUBLICATIONS

"EiceDRIVER 6ED family—2nd generation," Infineon, Datasheet, Revision 2.6, Aug. 5, 2016, 25 pp.
"AN-8201; FCM8201 Three-Phase Sine-Wave BLDC Motor Controller," Fairchild, Rev. 1.0.3, Apr. 8, 2014, 25 pp.
Zhen, "Sinusoidal Control of BLDCM with Hall Sensors Based on FRDM-KE04Z and Tower Board," Freescale Semiconductor, Rev. 0, Mar. 2014, 30 pp.

\* cited by examiner

*Primary Examiner* — Bickey Dhakal
*Assistant Examiner* — Zemenay T Truneh
(74) *Attorney, Agent, or Firm* — Shumaker & Sieffert, P.A.

(57) ABSTRACT

In some examples, a device includes a gate driver circuit and a control circuit configured to generate a first signal and a second signal, a duty cycle of the first signal encoding an amplitude of an electrical current having a sinusoidal shape, and a duty cycle of the second signal encoding a phase angle of the electrical current. The control circuit is configured to deliver the first and second signals to the gate driver circuit, which is configured to determine a duty cycle of a driver signal as a function of the first signal and of the second signal. The gate driver circuit is also configured to deliver the driver signal to a switch to cause the electrical current having the sinusoidal shape to be delivered to an electrical load.

21 Claims, 9 Drawing Sheets

SIGNALS FOR THE CONTROL OF POWER DEVICES

TECHNICAL FIELD

This disclosure relates to the control of power devices, such as electric motors.

BACKGROUND

A control circuit may drive a power device such as a motor by delivering control signals to a power conversion circuit. In a technique known as trapezoidal control, the back electromagnetic force (EMF) has a trapezoidal shape. The torque on the power device that results from trapezoidal control includes a ripple that can decrease the efficiency of the power device. Moreover, trapezoidal control can also cause audible noise at the power device.

Another technique for controlling a power device is called sinusoidal control, where the control circuit may cause a gate driver circuit to deliver pulse-modulated signals, such as pulse-width modulation signals (PWM) or pulse-frequency modulation signals, to a power conversion circuit. By varying the duty cycle, frequency, and/or phase of the pulse-modulated signals, the control circuit may cause the power conversion circuit to deliver electrical currents to the power device with a sinusoidal waveform. The power conversion circuit may drive the electrical currents through windings, causing the windings in the power device to create magnetic fields that vary over time. Ideally, the interaction between the varying magnetic fields and the magnets in a rotor of the power device should result in a torque to drive the power device, where the torque is proportional to the electrical currents through the windings.

One example sinusoidal control technique is V/Hz or V/f control, which includes algorithms to control motor speed based on the voltage applied to the windings. For V/Hz control, the speed of the rotor may increase with increasing voltage.

Sinusoidal control can provide better acoustic performance, which is more suitable for applications like refrigerator fans, HVAC (heating, ventilation, and air conditioning) fans, pumps, and other home appliances. Trapezoidal control can provide higher driving torque, which is more suitable for systems with heavy and unpredictable load conditions, such as power tools and actuators. However, implementing sinusoidal commutation normally requires digital signal processing or micro-controllers with high-frequency PWM modulators to achieve the desired resolution in time and generate the sinusoidal waveform.

SUMMARY

This disclosure describes techniques for generating and communicating information from a control circuit to a gate driver circuit that drives a switch, where the information includes the amplitude and phase angle of an electrical current delivered by the switch to an electrical load. The control circuit can encode the information in a first signal and a second signal. For example, the control circuit can encode the information in the duty cycle and/or frequency of the first signal, the duty cycle and/or frequency of the second signal, and/or the phase shift between the first signal and the second signal. The gate driver circuit may determine, based on the first and second signals, the duty cycle of a driver signal to deliver to the switch to cause the desired electrical current to be delivered to the electrical load.

In some examples, a device includes a gate driver circuit and a control circuit configured to generate a first signal, a duty cycle of the first signal encoding an amplitude of an electrical current having a sinusoidal shape. The control circuit is further configured to generate a second signal, a duty cycle of the second signal encoding a phase angle of the electrical current. The control circuit is configured to deliver the first and second signals to the gate driver circuit, which is configured to determine a duty cycle of a driver signal as a function of the first signal and of the second signal. The gate driver circuit is also configured to deliver the driver signal to a switch to cause the electrical current having the sinusoidal shape to be delivered to an electrical load.

In some examples, a device includes a gate driver circuit and a control circuit configured to generate a first signal, a duty cycle of the first signal encoding an amplitude of an electrical current having a sinusoidal shape. The control circuit is further configured to generate a second signal, a duty cycle of the second signal encoding information. The first signal is phase-shifted relative to the second signal by a phase shift that encodes a phase angle of the electrical current. The phase shift of the second signal relative to the first signal can also encode the phase angle of the electrical current. The control circuit is also configured to deliver the first signal and the second signal to the gate driver circuit. The gate driver circuit is configured to determine a duty cycle of a driver signal as a function of the first signal and of the second signal. The gate driver circuit is further configured to deliver the driver signal to a switch to cause the electrical current having the sinusoidal shape to be delivered to an electrical load.

In some examples, a system includes a power conversion circuit including a switch, a gate driver circuit, and a control circuit configured to generate a first signal, a duty cycle of the first signal encoding an amplitude of an electrical current having a sinusoidal shape. The control circuit is further configured to generate a second signal, a duty cycle of the second signal encoding a phase angle of the electrical current. The control circuit is also configured to deliver the first signal and the second signal to the gate driver circuit. The gate driver circuit is configured to determine a duty cycle of a driver signal as a function of the first signal and of the second signal. The gate driver circuit is further configured to deliver the driver signal to the switch to cause the electrical current having the sinusoidal shape to be delivered to an electrical load.

The details of one or more examples are set forth in the accompanying drawings and the description below. Other features, objects, and advantages will be apparent from the description and drawings, and from the claims.

DETAILED DESCRIPTION

This disclosure describes techniques for implementing sinusoidal control using a control circuit and a gate driver circuit. A gate driver circuit of this disclosure is configured to deliver a driver signal to cause a switch to deliver an electrical current having a sinusoidal shape to an electrical load. A control circuit of this disclosure may encode characteristics of the electrical current in a first signal and a second signal. The control circuit delivers the first signal and the second signal to the gate driver circuit in order to communicate the encoded characteristics of the electrical current to the gate driver circuit. The gate driver circuit can determine a duty cycle of the driver signal as a function of the information encoded in the first signal and the second signal.

The techniques of this disclosure may lead to reduced cost and reduced complexity, as compared to other techniques for implementing sinusoidal control. The techniques may move some of the complexity of implementing a sinusoidal commutation scheme into the gate driver circuit. The control circuit that generates the first signal and the second signal may include a processor (e.g., control circuit 210 shown in FIG. 2) and/or analog components such as an amplifier and an oscillator (e.g., control circuit 310 shown in FIG. 3).

Moving some of the complexity to the gate driver circuit may result in a higher cost for the gate driver circuit, but the cost of the control circuit may decrease, as compared to a device with a control circuit that includes a digital signal processor (DSP) and/or an advanced microcontroller. A device of this disclosure may be more reliable and have fewer defects, as compared to other devices, because software and firmware are not necessary. Software and firmware in a processor often need to undergo strict quality requirements.

Figure 1:
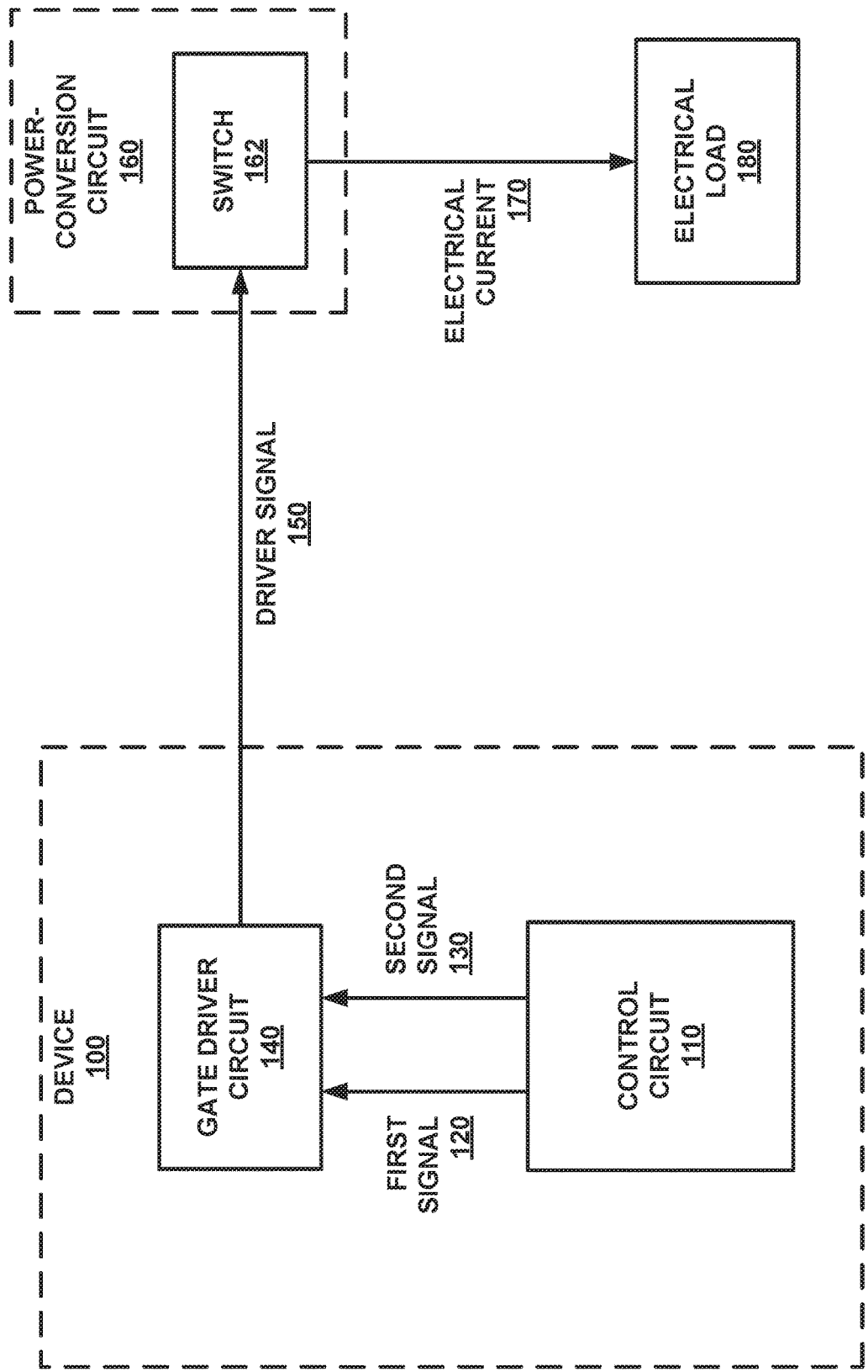
FIG. 1 is a conceptual block diagram of a device configured to cause a switch of a power-conversion circuit to deliver an electrical current to an electrical load, in accordance with some examples of this disclosure.

FIG. 1 is a conceptual block diagram of a device 100 configured to cause a switch 162 of a power-conversion circuit 160 to deliver an electrical current 170 to an electrical load 180, in accordance with some examples of this disclosure. Device 100 includes control circuit 110 and gate driver circuit 140. Although device 100 is shown separate from power-conversion circuit 160 and electrical load 180, device 100 can be integrated with power-conversion circuit 160 and/or electrical load 180 into a single device. The techniques of this disclosure also apply where control circuit 110 and gate driver circuit 140 are discrete components on separate chips.

Control circuit 110 is configured to generate signals 120 and 130 to encode information about electrical current 170. Control circuit 110 is able to control characteristics (e.g., parameters) of driver signal 150 by encoding information in signals 120 and 130 and delivering signals 120 and 130 to gate driver circuit 140. In the example of sinusoidal control mode, switch 162 delivers electrical current 170 having a sinusoidal shape to electrical load 180. Control circuit 110 may be configured to generate signals 120 and 130 as pulse-modulated signals (e.g., pulse-width modulated (PWM) signals). Control circuit 110 can modify the duty cycle, frequency, phase shift, the presence or absence of pulses, and/or other characteristics of signals 120 and 130 to encode the information about electrical current 170.

Figure 5:
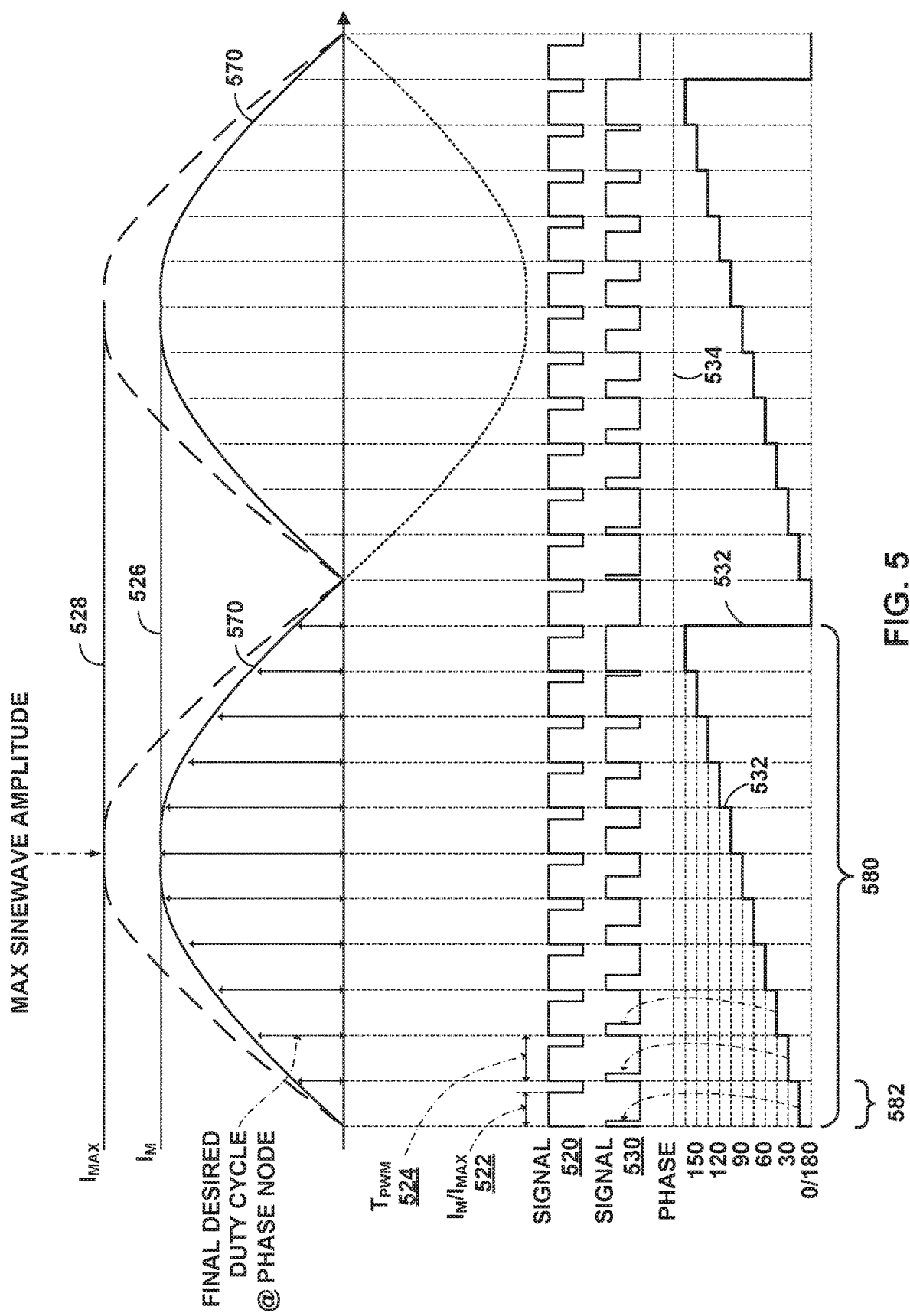
FIG. 5 illustrates further details of the sinusoidal control technique for determining characteristics of an electrical current, in accordance with some examples of this disclosure.

Control circuit 110 may be configured to determine a duty cycle of first signal 120 to encode the amplitude of the sinusoidal shape of electrical current 170. The shape of electrical current 170 is not necessarily exactly sinusoidal because electrical current 170 may include fluctuations, distortions, and ripples. The duty cycle of first signal 120 is defined as the percentage of time that first signal 120 has a high amplitude. Control circuit may determine the duty cycle (Duty_cycle$_1$) of first signal 120 as a function of the target amplitude ($I_M$) of electrical current 170 and the predetermined maximum amplitude ($I_{MAX}$) of the sinusoidal shape using Equation (1). Amplitudes 526 and 528 shown in FIG. 5 are examples of a target amplitude and a predetermined maximum amplitude, respectively.

$$\text{Duty\_cycle}_1 = I_M / I_{MAX} \tag{1}$$

As a consequence, the control of the target amplitude $I_M$ of the electrical current can be achieved by controlling the duty cycle Duty_cycle$_1$ of the first signal. In some examples, control circuit 110 may be configured to encode the target amplitude as a function of a phase shift between signals 120 and 130.

Control circuit 110 may be configured to determine a duty cycle of second signal 130 to encode the phase angle of electrical current 170. The phase angle is the instantaneous phase angle of electrical current 170 at an associated moment in time. As one will understand, the value of the phase angle varies over time (see, e.g., phase angle 532). The phase angle indicates a point along the sinusoidal curve of electrical current 170 in terms of degrees or radians. For example, the duty cycle of second signal 130 may represent a ratio between the phase angle of electrical current 170 and a predetermined angle value, such as 90 degrees ($\pi/2$ radians), 180 degrees ($\pi$ radians), or 360 degrees ($2\pi$ radians). Control circuit 110 may determine the duty cycle (Duty_cycle$_2$) of second signal 130 by dividing the target phase angle ($\theta_{target}$) by the predetermined angle value ($\theta_{predet.}$), as shown in Equation (2). If, for example, the predetermined angle value is 180 degrees (see, e.g., FIG. 5), and the target phase angle of electrical current 170 is 45 degrees, control circuit 110 may determine a duty cycle of 0.25 for second signal 130.

$$\text{Duty\_cycle}_2 = \theta_{target} / \theta_{predet.} \tag{2}$$

Gate driver circuit 140 may be configured to receive second signal 130 and determine the phase angle of electrical current 170 based on the duty cycle of second signal 130. For example, gate driver circuit 140 determines the duty cycle of signal 130 by measuring the duration of a high pulse of signal 130 and dividing the duration by the total time period of one cycle of signal 130. Gate driver circuit 140 may determine the phase angle by multiplying the duty cycle of second signal 130 by the predetermined angle value, as shown in Equation (3) below.

$$\theta_{target} = \text{Duty\_cycle}_2 \times \theta_{predet.} \tag{3}$$

Gate driver circuit 140 may then be configured to determine a factor based on a trigonometric function (e.g., a sinusoidal function, a cosine function, etc.). For instance, the phase angle is used, e.g., by gate driver circuit 140, as the input of the trigonometric function for determining the factor. The factor advantageously has a positive or null value. For instance, the factor is determined using one of Equations (4a) and (4b), where "A", "a", and "b" are parameters, and where "A" and "a" advantageously have non-null values. In Equations (4a) and (4b), "A" is an amplitude of the respective trigonometric function.

$$\text{Factor} = A \sin(a \times \theta_{target} + b) \quad (4a)$$

$$\text{Factor} = A \cos(a \times \theta_{target} + b) \quad (4b)$$

In some examples, the factor may be chosen as equal to the absolute value of the right term of Equation (4a) or (4b) instead. In an advantageous embodiment, Equation 4a is used with A and a being equal to 1 and b being equal to 0 (i.e. Factor=$\sin \theta_{target}$). $\theta_{target}$ is advantageously then comprised between 0 and 180 degrees.

Circuits 110 and 140 are not limited to using a trigonometric function, e.g., that of Equations (4a) and (4b), for electrical current 170. In some examples, circuits 110 and 140 instead use an approximation of a trigonometric function for the determination of the factor, such as a polynomial approximation, an example of which is shown in Equation (4c), or a trigonometric transformation.

$$\text{Factor} = Ax^n + Bx^{n-1} + \ldots + Cx + D; \text{ where } x = \theta_{target} \quad (4c)$$

Gate driver circuit 140 may be further configured to determine a duty cycle of driver signal 150 as shown in Equation (5). Gate driver circuit 140 may multiply the duty cycle of first signal 120 and the numerical value of the factor to determine the duty cycle of driver signal 150. When the duty cycle of first signal 120 is one hundred percent, the duty cycle of driver signal 150 is equal to the predetermined maximum amplitude, such that the duty cycle of driver signal 150 is equal to one hundred percent.

$$\text{Duty}_{cycle_{driver}} = \text{Duty}_{cycle_1} \times \text{Factor} \quad (5)$$

In some examples where the Factor is negative, an absolute value thereof may be used instead for the purpose of Equation (5). In some examples where the Factor is negative, it may be constrained to an arbitrary value for the purpose of Equation (5), such as a null value.

As an example, control circuit 110 may generate first signal 120 with a duty cycle of fifty percent and generate second signal 130 with a duty cycle of fifty percent. Based on the duty cycle of second signal 130, gate driver circuit 140 may determine that the phase angle of electrical current 170 delivered by switch 162 should be equal to 90 degrees using a predetermined angle value of 180 degrees and Equation (3). Using one of Equations (4a)-(4c), gate driver circuit 140 may determine that the factor has a numerical value of one because the trigonometric function has an output of one when the input to the trigonometric function is 90 degrees (e.g., y=sin x). Gate driver circuit 140 may then determine a duty cycle of fifty percent for driver signal 150 based on Equation (5) and the duty cycle of fifty percent for first signal 120.

Additionally or alternatively, control circuit 110 may be configured to encode other information in the characteristics of signals 120 and 130. For example, control circuit 110 may be configured to encode the frequency of driver signal 150 as a function of a frequency of first signal 120, of a frequency of second signal 130, or of both these frequencies. In some examples, first signal 120 has a different respective frequency than second signal 130 (see, e.g., FIG. 6B). Gate driver circuit 140 may be configured to set the frequency of driver signal 150 as the frequency of the corresponding one of signals 120 and 130 (e.g., N=1). The frequency of driver signal 150 may also be a fraction (N<1) or a multiple (N>1) of the frequency of the corresponding one of signals 120 and 130 (Frequency$_1$), as shown in Equation (6b).

$$\text{Frequency}_1 = N \times \text{Frequency}_{driver} \quad (6a)$$

$$\text{Frequency}_{driver} = \left(\frac{1}{N}\right) \times \text{Frequency}_1 \quad (6b)$$

The frequency of driver signal 150 may also be set based on both the frequencies of signals 120 and 130, and for instance takes the form of a combination thereof, such as a linear combination, having predetermined weights which may or may not vary.

Using Equation (6b), gate driver circuit 140 can determine the frequency of driver signal 150 from the frequency of first signal 120 (or from the frequency of second signal 130). In some examples, first signal 120 and/or second signal 130 has a frequency that is N times a frequency of driver signal 150, where N is an integer greater than or equal to two. Using a higher frequency for signal 120 and/or signal 130 allows for the encoding of more information per cycle of driver signal 150.

Control circuit 110 may encode side information in one or both of signals 120 and 130. The side information may be transparent relative to the signal that encodes the side information, so that control circuit 110 and gate driver circuit 140 can determine the side information from the signal. The side information can be a rate of acceleration, a direction of rotation, specific fault blanking, recirculation high side or low side, fault reset/clear, fault comparator threshold change, active/diode freewheeling, and/or a command such as a brake command for a rotor in electrical load 180. This list of possible side-information variables is not exhaustive and may also include any change of state of any internal programmable part of control circuit 110 or gate driver circuit 140 and/or to any characteristic of driver signal 150, such as phase comparator threshold event, overcurrent protection threshold event, gain of a driver event, delay of the driver event, and dead times. Control circuit 110 may encode the side information in the frequency or one or both of signals 120 and 130 and/or a subinterval of cycles of one or both of signals 120 and 130 (e.g., FIG. 6B).

Control circuit 110 can also encode side information in a phase shift between signals 120 and 130. First signal 120 may be phase-shifted relative to second signal 130 if the active edges (e.g., rising edges and/or falling edges) of signals 120 and 130 are not always aligned in time. For example, if the frequency of first signal 120 is equal to the frequency of second signal 130, and there is no phase shift between signals 120 and 130, the rising edge of first signal 120 may be aligned in time with the rising edge of second signal 130 for each period (see, e.g., FIG. 6A). Equation (7) shows an example for determining a phase shift as a fraction with the numerator set to a time difference in active edges and the denominator set to the time period of signals 120 and 130 (e.g., the inverse of the frequencies of signals 120 and 130). For instance, $t_{active\_130}$ and $t_{active\_120}$ correspond to the respective instants in time at which a given cycle of the signal 130 and a corresponding cycle of the signal 120 begin or end. Thus, the duty cycle of signals 120 and 130 may not affect the phase shift because the phase shift equals the delay between the beginning times of signals 120 and 130 or the delay between the end times of signals 120 and 130. If the frequencies of signals 120 and 130 are equal and there is a phase shift of twenty percent between signals 120 and 130, the rising and/or falling edges of first signal 120 may occur one-fifth of one period before the corresponding edges of second signal 130. Thus, the phase shift may have a numerical value between zero and one, where the numerical value of the phase shift can encode side information.

$$\text{Phase shift} = \frac{t_{active\_120} - t_{active\_130}}{t_{period}} \quad (7)$$

It should be noted that any predetermined value may be used as denominator in Equation (7) to produce the value of the phase shift. Thus, the phase shift may have a value greater than one depending on the denominator.

In some examples, control circuit 110 encodes the phase angle of electrical current 170 in the phase shift between signals 120 and 130. Gate driver circuit 140 can determine the phase shift between signals 120 and 130 by determining the time delay between the active edges of signals 120 and 130, for instance together with Equation (7). Gate driver circuit 140 can determine the phase angle ($\theta_{target}$) of electrical current 170 based on the determined phase shift and a predetermined angle value ($\theta_{predet.}$), as shown in Equation (8).

$$\theta_{target} = \text{Phase shift} \times \theta_{predet.} \quad (8)$$

In another example, the phase shift between signals 120 and 130 may be used to encode the amplitude of the electrical current instead. For instance, gate driver circuit 140 may be configured to retrieve the amplitude by multiplying the phase shift by the maximum amplitude $I_{MAX}$.

Gate driver circuit 140 is configured to deliver driver signal 150 to switch 162. Gate driver circuit 140 may be able to turn on and turn off switch 162 by controlling the voltage of driver signal 150. Driver signal 150 may be a pulse-modulated signal, such as a PWM signal, a pulse-density-modulated signal, and/or a pulse-frequency-modulated signal. Gate driver circuit 140 may deliver driver signal 150 to a control terminal of switch 162.

Power-conversion circuit 160 includes switch 162. In some examples, power-conversion circuit 160 includes more than one switch, such as a half-bridge circuit with two switches or a three-phase power-conversion circuit with six switches, where each phase includes a half-bridge circuit. Gate driver circuit 140 may deliver a driver signal to the control terminal of each switch of power-conversion circuit 160. Power-conversion circuit 160 may include a half-bridge circuit, an H-bridge circuit, a multi-phase conversion circuit, a buck conversion circuit, a boost conversion circuit, a buck-boost conversion circuit, a forward conversion circuit, a resonant-mode conversion circuit, and/or any other power conversion circuit.

Switch 162 may be a power switch such as, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control. Switch 162 may include an n-type transistor or a p-type transistor, and switch 162 may be a power transistor. In some examples, switch 162 may be a vertical transistor, a lateral transistor, and/or a horizontal transistor. In some examples, switch 162 may include another analog device such as a diode and/or a thyristor.

Switch 162 may also include a freewheeling diode connected in parallel with a transistor to prevent reverse breakdown of switch 162.

Switch 162 may include three terminals: two load terminals and a control terminal. For a MOSFET switch, switch 162 may include a drain terminal, a source terminal, and at least one gate terminal, where the control terminal is a gate terminal. For BJT switches, control terminals may be base terminals. Electrical current 170 may flow between the load terminals of switch 162, based on the voltage at the control terminal, to electrical load 180.

Switch 162 may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. In some examples, silicon carbide switches may experience lower switching power losses. Improvements in magnetics and faster switching, such as Gallium Nitride switches, may support higher frequency converters. These higher frequency circuits may require control signals to be sent with more precise timing, as compared to lower-frequency circuits.

Electrical load 180 may include an electric motor, an electrical circuit, an electronic device, a light-producing device, a sound-producing device, and/or any other electrical load. In some examples, electrical load 180 is an electric motor including windings configured to receive electrical current 170. Electrical load 180 may also include a rotor, where control circuit 110 is configured to control the speed, rate of acceleration, and direction of rotation of the rotor. Electrical load 180 may include a sensor or sensing circuit configured to deliver a sense signal to device 100, where the sense signal indicates the operation of electrical load 180, the amount of electrical current 170 delivered to electrical load 180, and/or the back EMF at electrical load 170.

In some examples, electrical load 180 is a multi-phase electric motor including a winding for each phase. Each winding receives an electrical current from power-conversion circuit 160 and generates a magnetic field based on the electrical current. Each electrical current generated by power-conversion circuit 160 may have a sinusoidal shape with a frequency that is equal to the frequency of the rotation of the rotor of electrical load 180. The frequency of driver signal 150 may be much greater than the frequency of the electrical currents. Driver signal 150 may drive the switches of power-conversion circuit 160 to deliver the electrical currents to electrical load 180. In the example of an N-phase electric motor driver, gate driver circuit 140 may deliver N, 2N, or 4N driver signals to the switches of power-conversion circuit 160 to cause the switches to deliver N electrical currents to electrical load 180.

Figure 2:
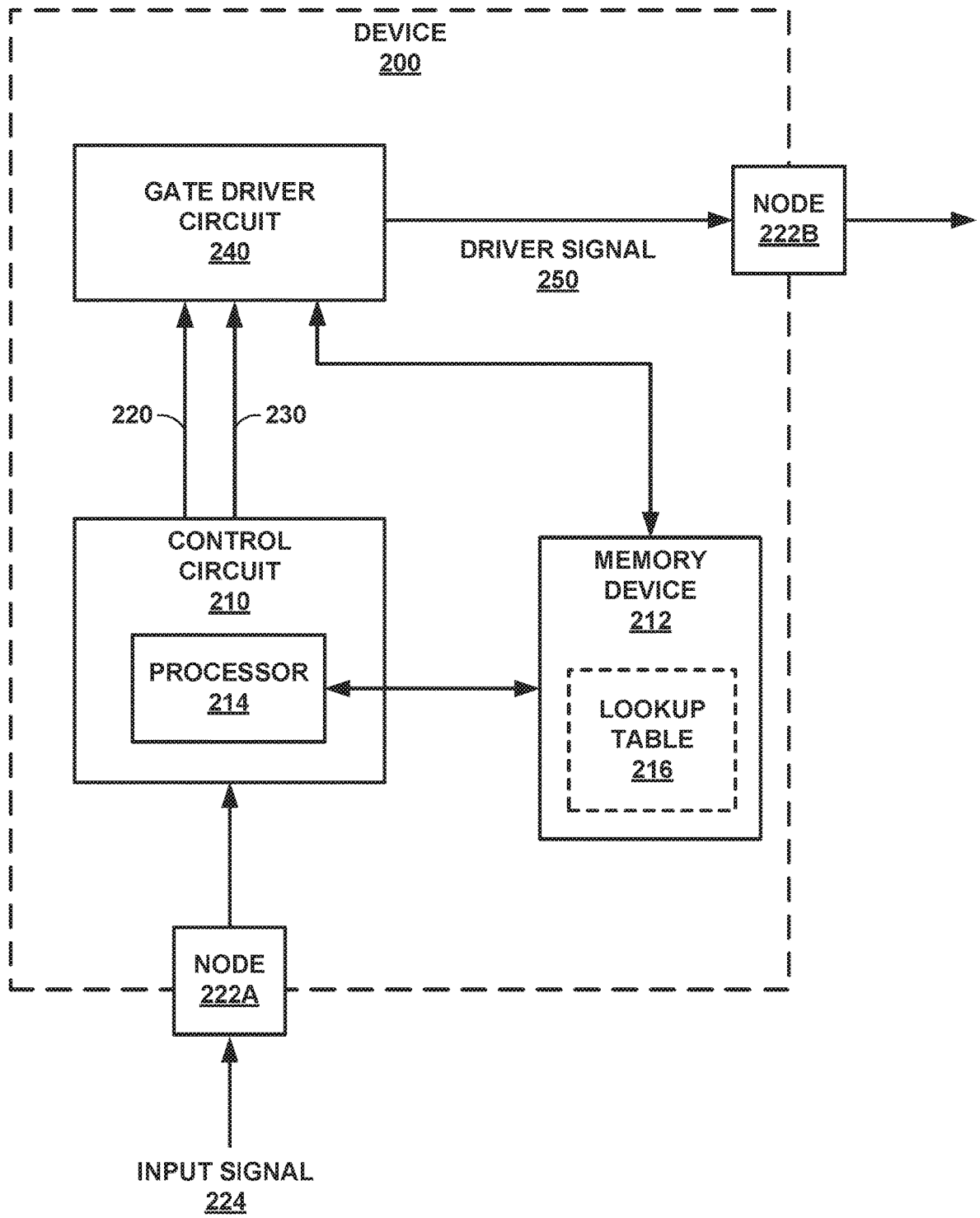
FIG. 2 is a conceptual block diagram of a device including a processor and a memory device, in accordance with some examples of this disclosure.

FIG. 2 is a conceptual block diagram of a device 200 including a processor 214 and a memory device 212, in accordance with some examples of this disclosure. Memory device 212 is configured to store data relating to the operation of processor 214 and gate driver circuit 240. Memory device 212 may store data indicating a predetermined maximum amplitude for an electrical current, a predetermined angle value for a trigonometric function, a predetermined amount for an offset for two or more electrical currents. For a three-phase electrical load, the predetermined amount may be 120 degrees between each of the three electrical currents.

Memory device 212 may include optional lookup table 216 configured to store input values and output values for a trigonometric function or an approximation thereof, e.g., that of Equations (4a)-(4c). Processor 214 and/or gate driver circuit 240 may be configured to provide to memory device 212 an address corresponding to the input value for the trigonometric function. For example, gate driver circuit 240 may determine the phase angle from second signal 230 and use the phase angle as an input value for the trigonometric function stored to memory device 212 and/or lookup table 216. At the address corresponding to the phase angle, memory device 212 may store a factor between zero and one. For example, at an address for the phase angle of thirty degrees, memory device 212 may store a factor of 0.5.

Lookup table 216 is only one example of a means for processor 214 and/or gate driver circuit 240 to determine a factor and/or a duty cycle for driver signal 250. There are other means for implementing a trigonometric function or an approximation of a trigonometric function. As one example, processor 214 and/or gate driver circuit 240 can use a mixture of a lookup table and an approximation, such as a linear approximation, a trigonometric approximation, a Taylor series approximation, a polynomial approximation, and/or any other approximation. Processor 214 and/or gate driver circuit 240 can use any of the listed approximations to approximate the trigonometric function. As another example, processor 214 and/or gate driver circuit 240 can use an algorithm, such as a coordinate rotation digital computer (Cordic) algorithm or a known complex algorithm.

Processor 214 may include any combination of integrated circuitry, discrete logic circuitry, analog circuitry, such as one or more microcontrollers, one or more microprocessors, DSPs, application specific integrated circuits (ASICs), and/or field-programmable gate arrays (FPGAs). The term "processor" refers one or more processors distributed across one or more devices. For example, "processor" can include a single processor or multiple processors on a device. "Processor" can also include processors on multiple devices, where the operations described herein may be distributed across multiple processors and/or multiple devices.

Processor 214 may be configured to determine a target amplitude and a target phase angle of the electrical current based on input signal 224 received at node 222A. Processor 214 may use these target values to determine the characteristics of signals 220 and 230. Input signal 224 may be a sense signal indicating the operation of an electrical load and/or the electrical current delivered by a switch to the electrical load. Input signal 224 may originate from a Hall sensor placed near the electrical load (e.g., near a rotor). Input signal 224 may also originate from the back EMF (BEMF) in the example of sensorless control. In some examples, gate driver circuit 240 includes a Hall sensor or a BEMF sensor. Therefore, gate driver circuit 240 can autonomously define synchronization of the phases without intervention from processor 214, which simplifies the feedback loop shown in FIG. 2 by possibly removing the need for control circuit 210.

Nodes 222A and 222B may include pins, leads, leadframe segments, metallization layers, and/or any other suitable conductive nodes for receiving input signal 224 and outputting driver signal 250. Nodes 222A and 222B can be positioned on the surface or on the housing of device 200.

Figure 3:
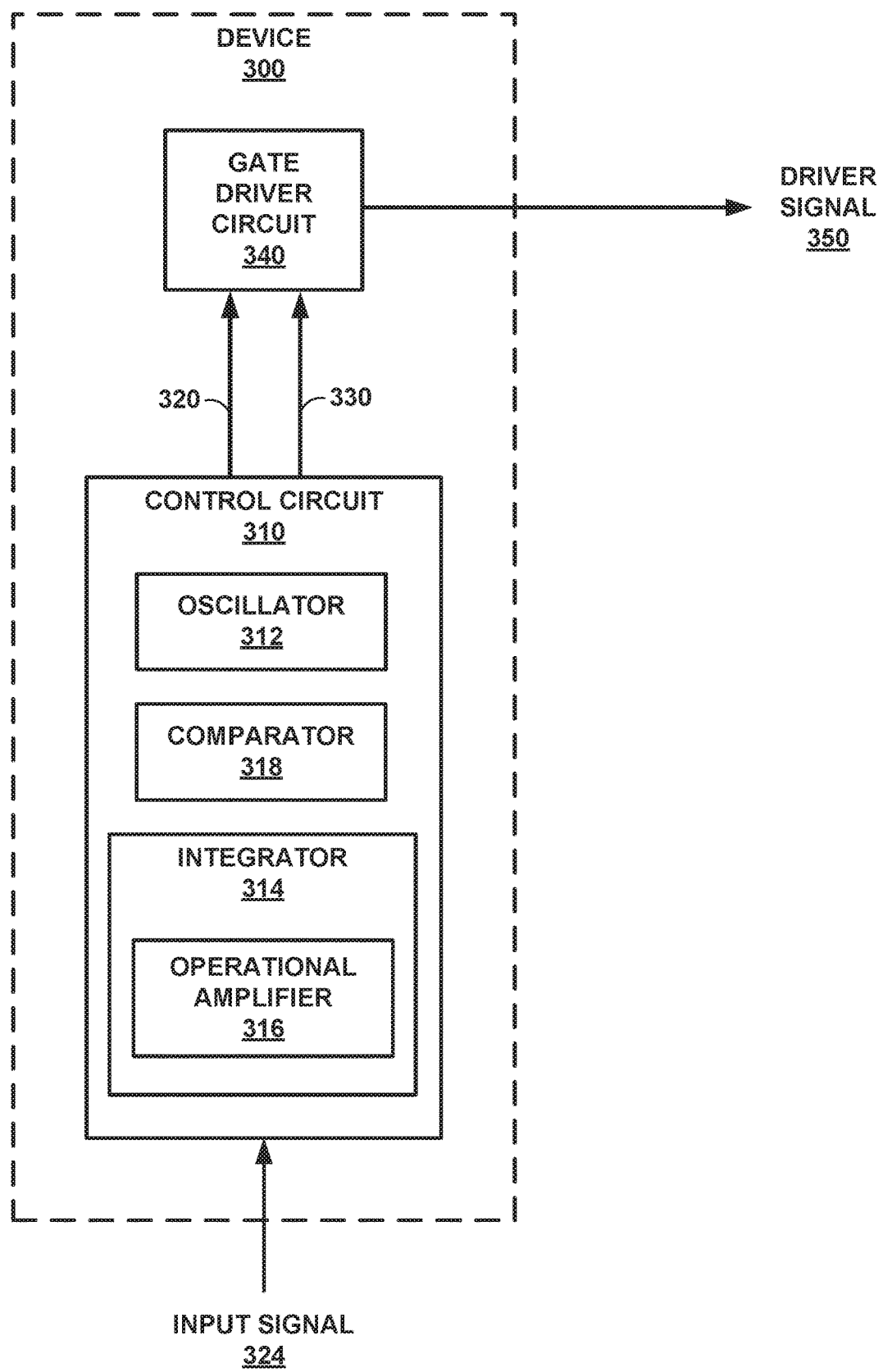
FIG. 3 is a conceptual block diagram of a device including an oscillator and an operational amplifier, in accordance with some examples of this disclosure.

FIG. 3 is a conceptual block diagram of a device 300 including an oscillator 312 and an operational amplifier 316, in accordance with some examples of this disclosure. Oscillator 312 may be a voltage-controlled oscillator (VCO) configured to output a clock signal for integrator 314. Operational amplifier 316 may generate a triangle waveform or a sawtooth waveform based on the clock signal. Comparator 318 may be configured to generate signals 320 and 330 by comparing the triangle waveform or the sawtooth waveform to a reference signal. The reference signal may be input signal 324 or a signal determined as a function of input signal 324.

Figure 4A:
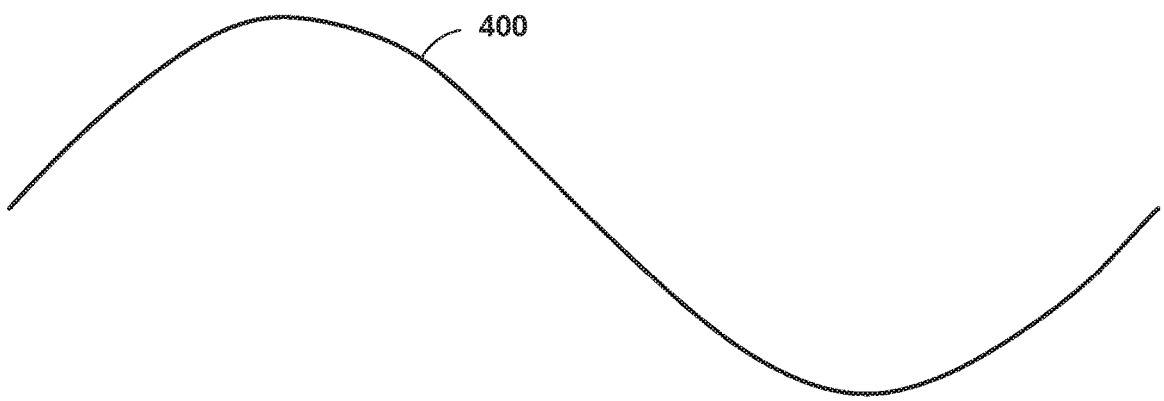
FIGS. 4A-4C illustrate the sinusoidal control technique for determining the duty cycle for a driver signal.
Figure 4B:
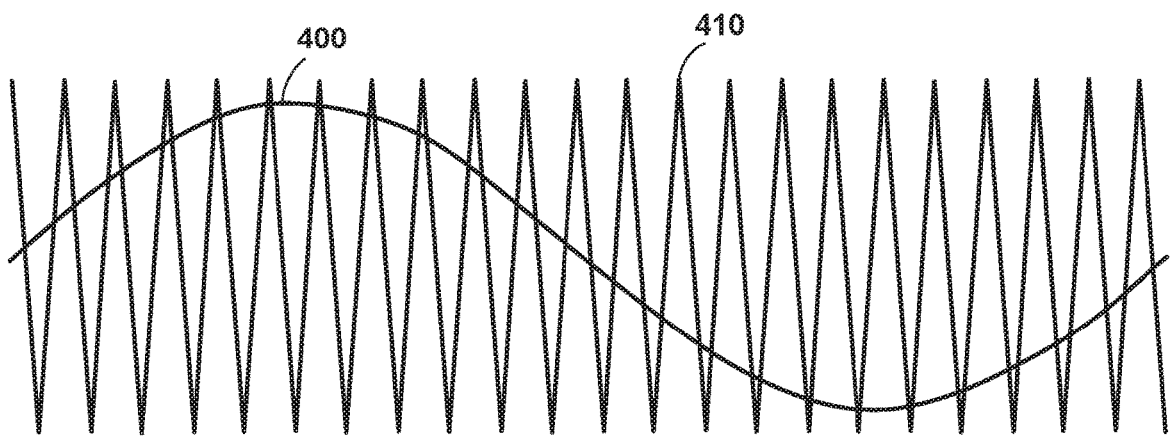
Figure 4C:
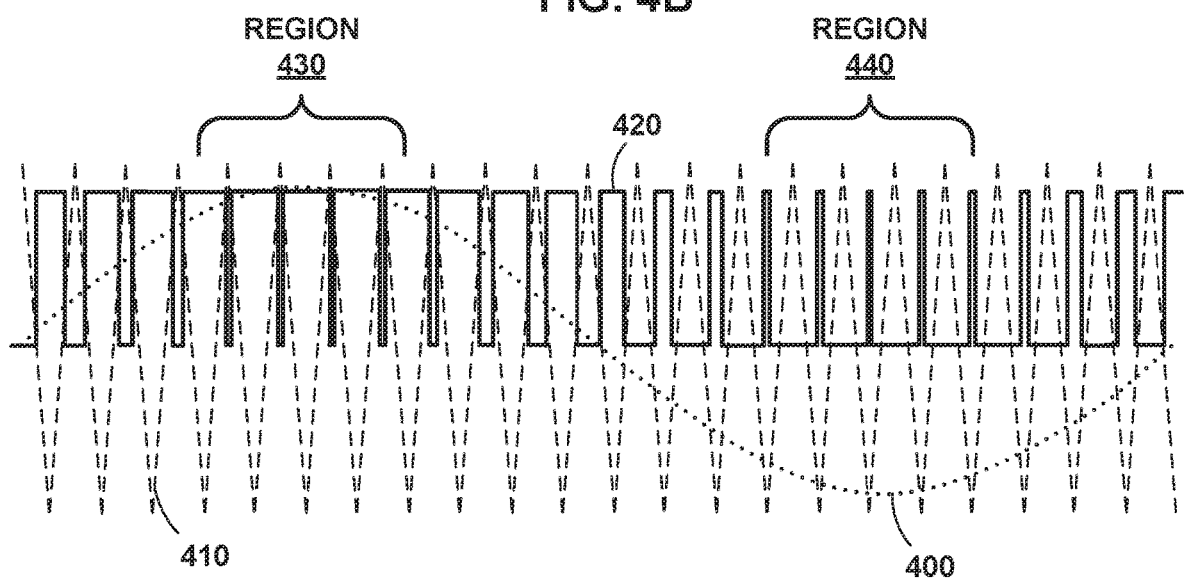

FIGS. 4A-4C illustrate the sinusoidal control technique for determining the duty cycle for a driver signal 420. The duty cycle of driver signal 420 is based on the percentage time that an amplitude of sinusoidal carrier waveform 400 is greater than an amplitude of triangular waveform 410. A gate driver circuit can generate driver signal 420 by using sinusoidal carrier waveform 400 and triangular waveform 410 at the desired driver frequency. In the example of FIG. 4C, the frequency of triangular waveform 410 is the same as the frequency of driver signal 420.

A gate driver circuit may include a comparator that receives sinusoidal carrier waveform 400 and triangular waveform 410 as input signals and generates driver signal 420 as an output signal. For example, when the amplitude of sinusoidal carrier waveform 400 is greater than the average amplitude of triangular waveform 410, e.g., in region 430, the gate driver circuit may generate driver signal 420 with a duty cycle greater than fifty percent. When the amplitude of sinusoidal carrier waveform 400 is less than the average amplitude of triangular waveform 410, e.g., in region 440, the gate driver circuit may generate driver signal 420 with a duty cycle less than fifty percent.

FIG. 5 illustrates further details of the sinusoidal control technique for determining characteristics of an electrical current 570, in accordance with some examples of this disclosure. FIG. 5 shows signals 520 and 530, which may be generated by control circuit 110 and received by gate driver circuit 140 of FIG. 1. Signals 520 and 530 are examples of signals 120 and 130 shown in FIG. 1, signals 220 and 230 shown in FIG. 2, and signals 320 and 330 shown in FIG. 3. Although FIGS. 5 and 6 are described with respect to device 100 of FIG. 1, devices 200 and 300 of FIGS. 2 and 3 may perform similar techniques.

In the example of FIG. 5, control circuit 110 may generate signal 520 to encode amplitude 526 ($I_M$) of electrical current 570. The duty cycle of signal 520 is equal to the duration of the high pulse of signal 520 (duration 522) divided by the duration of a period of signal 520 (duration 524). A duty cycle of one hundred percent for signal 520 could encode an amplitude that is equal to predetermined maximum amplitude 528 at a phase angle of 90 degrees. Control circuit 110 may use Equation (1) to determine the duty cycle of signal 520, and gate driver circuit 140 can use Equation (5) to determine the duty cycle of driver signal 150 based on the duty cycle of signal 520.

Control circuit 110 may generate signal 530 to encode phase angle 532 of electrical current 570. The duty cycle of signal 530 is equal to the duration of the high pulse of signal 530 divided by the duration of a period of signal 530 (duration 582). In the example of FIG. 5, duration 582 is equal to duration 524, but in some examples the frequency of signal 520 is not the same as the frequency of signal 530 (see, e.g., FIG. 6B). A duty cycle of one hundred percent for signal 530 could encode a phase angle that is equal to predetermined angle value 534, shown in FIG. 5 as 180 degrees. Control circuit 110 may use Equation (2) to determine phase angle 532 of signal 530, and gate driver circuit 140 can use Equation (3) to determine phase angle 532 based on the duty cycle of signal 530.

In the example of FIG. 5, the frequency of signals 520 and 530 is twelve times higher than the frequency of electrical current 570. If predetermined angle value 534 equals one hundred and eighty degrees, control circuit 110 may increase the duty cycle of signal 530 by 8.33% for each period of signal 530 before resetting the duty cycle to zero at the end of duration 580. Based on the duty cycle of signal 530, gate driver circuit 140 may increase phase angle 532 by fifteen degrees for each period of signal 530 before resetting phase angle 532 to zero at the end of duration 580. Predetermined angle value 534 is equal to 180 degrees in the example of FIG. 5, but predetermined angle value 534 may have other values, such as 90 degrees or 360 degrees. If predetermined angle value 534 is set to 90 degrees or 180 degrees, phase angle 532 will not represent the full 360 degrees of the sinusoidal shape of electrical current 570, but gate driver circuit 140 can complete the sinusoidal shape using tracking, extrapolation, and/or any other suitable technique.

Gate driver circuit 140 can determine a numerical value of a factor by inputting phase angle 532 into a trigonometric function or an approximation thereof, as shown in Equations (4a)-(4c). Gate driver circuit 140 can determine the duty cycle of driver signal 150 by multiplying the factor and the duty cycle of signal 520, as shown in Equation (5). Gate driver circuit 140 may read the factor value from a memory device, which may store an array or a lookup table including the numerical values of the factor and associated values of phase angle 532. The duty cycle of driver signal 150 may be approximately equal to the duty cycle of the voltage level at a phase node of power-conversion circuit 160.

In some examples, there are three phases of driver signals, and gate driver circuit 140 determines the duty cycles of all of the driver signals based on Equations (1)-(5) and predetermined amounts for the offsets between the three phases. Gate driver circuit 140 may use these techniques to determine the duty cycles of driver signal 150 for negative values of electrical current 170. This technique for determining duty cycles reduces the amount of memory that is needed to store data for the trigonometric function.

Figure 6A:
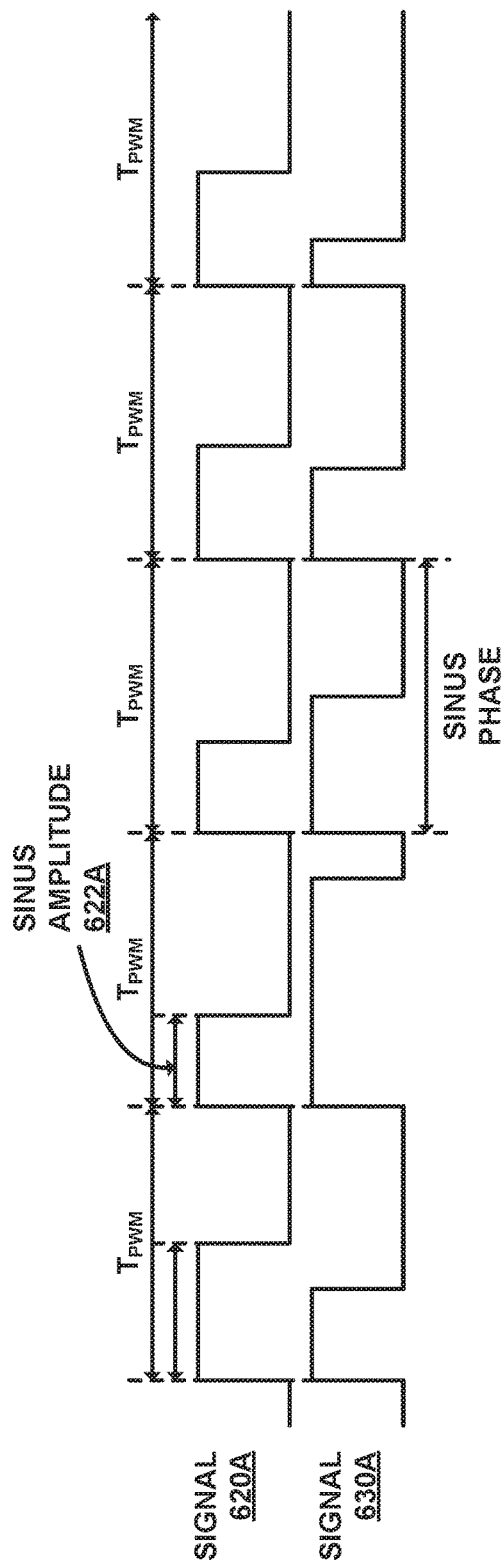
FIGS. 6A and 6B illustrate two signals that encode amplitude and a phase angle of a sinusoidal waveform, in accordance with some examples of this disclosure.
Figure 6B:
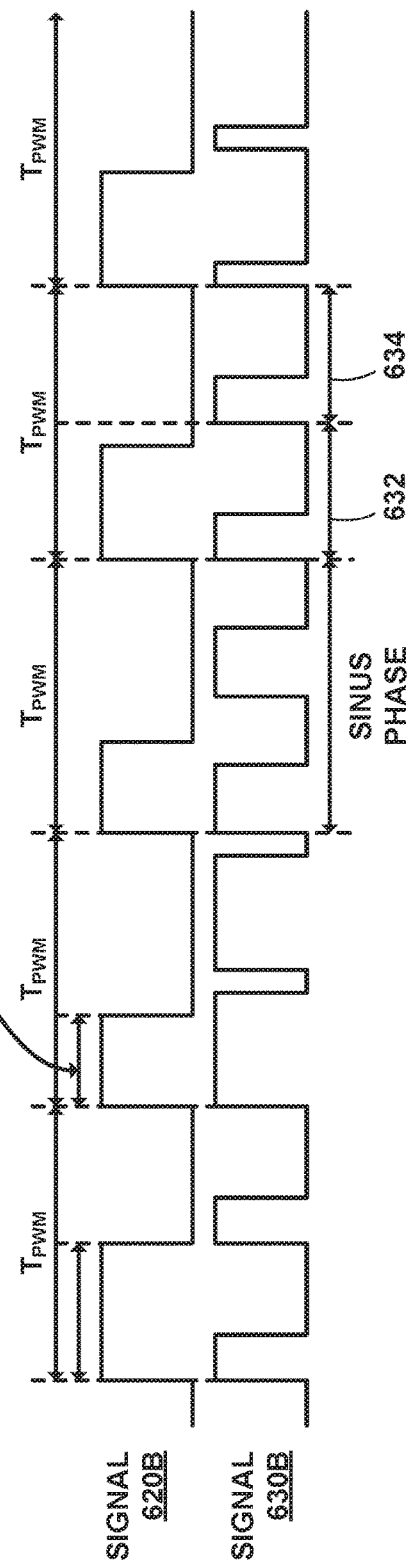

FIGS. 6A and 6B illustrate two signals that encode amplitude and a phase angle of an electrical current, in accordance with some examples of this disclosure. Signals 620A and 630A shown in FIG. 6A and signals 620B and 630B shown in FIG. 6B are examples of signals 120 and 130 shown in FIG. 1, signals 220 and 230 shown in FIG. 2, signals 320 and 330 shown in FIG. 3, and signals 520 and 530 shown in FIG. 5. In the examples of FIGS. 6A and 6B, signal 620A has the same frequency as signal 630A, equal to the inverse of $T_{PWM}$, and signal 630B has a frequency that is two times the frequency of signal 620B.

The duty cycles of signals 620A and 620B encode the amplitude of electrical currents. For example, gate driver circuit 140 can determine the duty cycle of signals 620A and 620B by dividing durations 622A and 622B by the period $T_{PWM}$. Gate driver circuit 140 may determine the amplitude of electrical current 170 to be proportional to the duty cycle of the duty cycle of signal 620A or 620B using Equation (1).

FIG. 6A shows an example where a phase angle of electrical current 170 is encoded in the duty cycle of signal 630A across a full period $T_{PWM}$. FIG. 6B shows an example where the frequency of signal 630B is twice the frequency of signal 620B. In some examples, signal 630B includes two subintervals (e.g., time periods) for each $T_{PWM}$ period or cycle of signal 620B. For example, subinterval 632 may encode the phase angle of electrical current 170, and subinterval 634 may encode side information, such as acceleration, direction of rotation, and/or other commands.

The presence or absence of one or more pulses in subinterval 632 or 634 may encode the side information. Although FIG. 6B depicts the presence of one pulse in each of subintervals 632 or 634, a subinterval of signal 630B may have zero, one, two, or any number of pulses. Control circuit 110 may generate signal 630B to encode side information in the number of pulses in a subinterval. Control circuit 110 can also generate signal 630B to encode information in the duty cycle of subinterval 632 and to define a phase shift between signals 620B and 630B in subinterval 634. For example, if subinterval 632 includes a pulse but subinterval 634 has no pulse, then gate driver circuit 140 operates in a first state or control mode. If instead gate driver circuit 140 detects pulses in both of subintervals 632 and 634, gate driver circuit 634 operates in a second state or control mode based on the additional command. In both cases, signal 630B includes the phase angle information, for example, as the total pulse width over one PWM period ($T_{PWM}$).

FIGS. 7-9B are flow diagrams illustrating example techniques for causing a switch to deliver an electrical current to an electrical load, in accordance with some examples of this disclosure. The techniques of FIGS. 7-9B are described with reference to device 100 in FIG. 1, although other components, such as devices 200 and 300 in FIGS. 2 and 3, may exemplify similar techniques.

Figure 7:
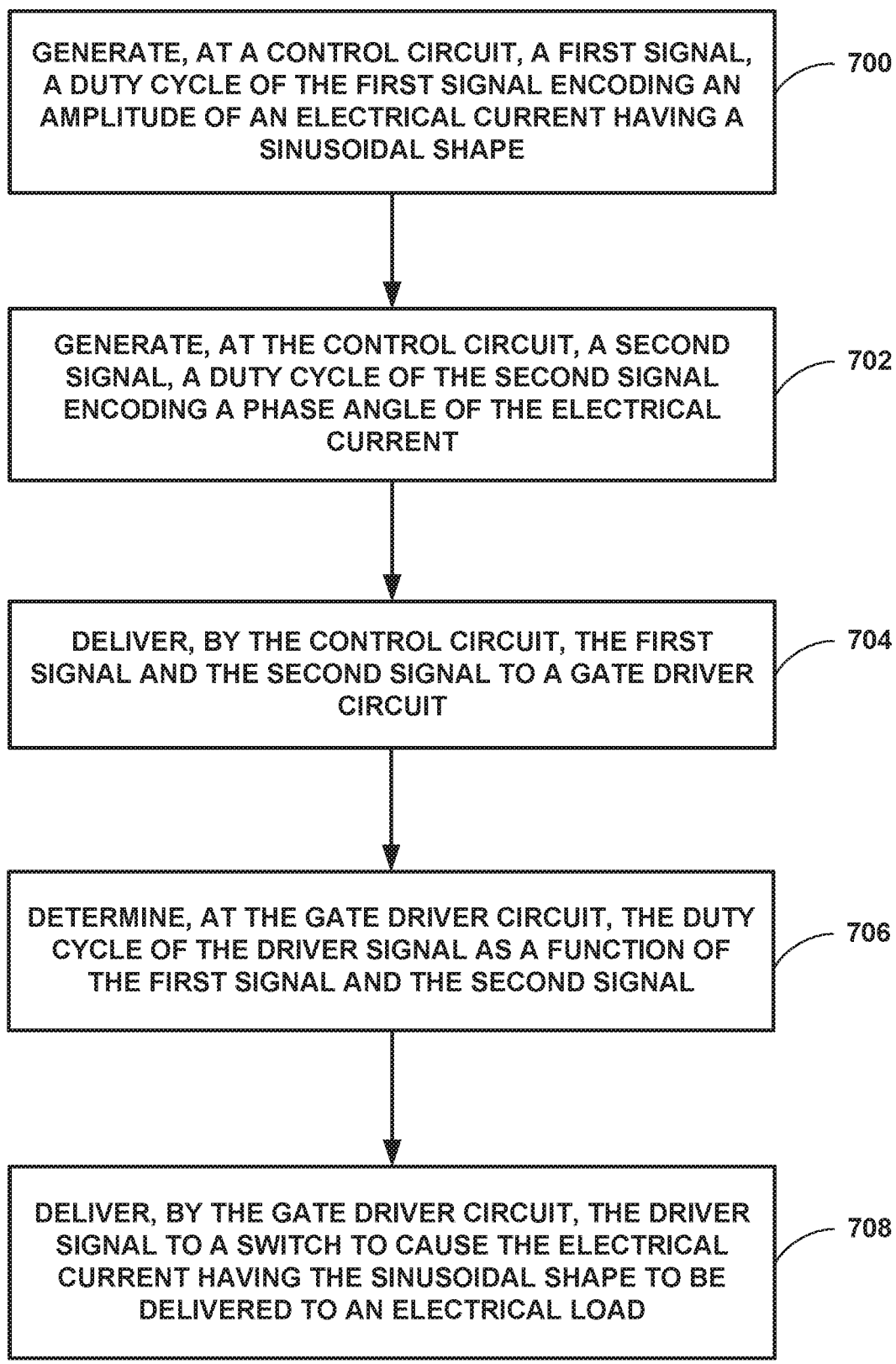
FIGS. 7-9B are flow diagrams illustrating example techniques for causing a switch to deliver an electrical current to an electrical load, in accordance with some examples of this disclosure.

The technique of FIG. 7 includes control circuit 110 generating first signal 120, where a duty cycle of first signal 120 encodes an amplitude of electrical current 170 having a sinusoidal shape (700). Control circuit 110 can encode the amplitude of electrical current 170 in the duty cycle of signal 120 as a function of a predetermined maximum amplitude using Equation (1). The technique of FIG. 7 also includes control circuit 110 generating second signal 130, where a duty cycle of second signal 130 encodes a phase angle of electrical current 170 (702). Control circuit 110 can encode the phase angle of electrical current 170 as a function of a predetermined angle value using Equation (2). Control circuit 110 then delivers signals 120 and 130 to gate driver circuit 140 (704).

The technique of FIG. 7 also includes gate driver circuit 140 receiving signals 120 and 130 and determining a duty cycle of driver signal 150 as a function of signals 120 and 130 (706). Driver signal 150 can be a pulse-modulated signal (e.g., a square waveform). Gate driver circuit 140 can determine the duty cycle of driver signal 150 based on the duty cycles of signals 120 and 130 using Equations (3-5). The technique of FIG. 7 includes gate driver circuit 140 delivering driver signal 150 to switch 162 to cause switch 162 to deliver electrical current 170 having the sinusoidal shape to electrical load 180 (708).

Figure 8:
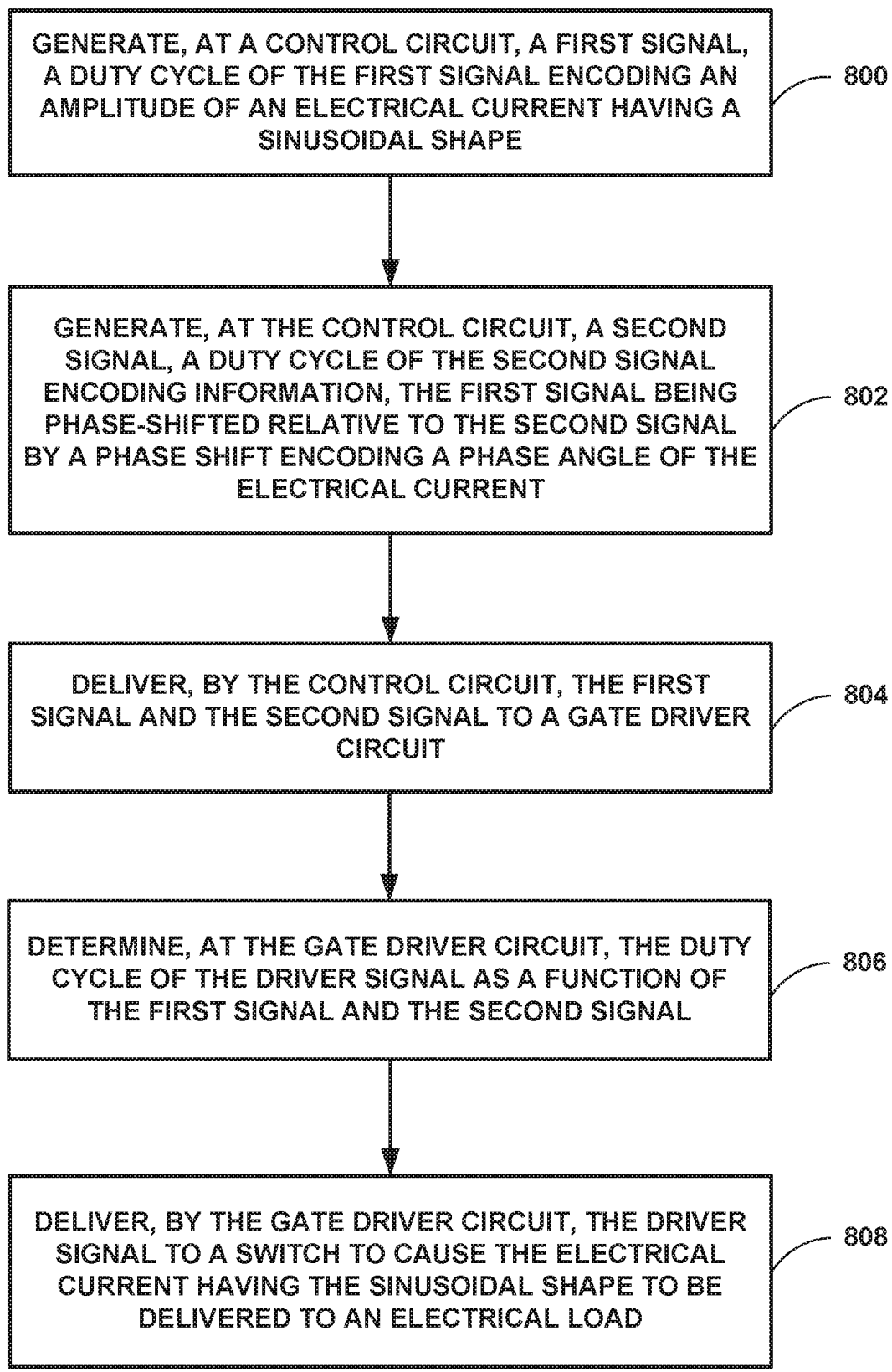

FIG. 8 depicts a technique for encoding the phase angle in the phase shift between signals 120 and 130. The technique of FIG. 8 includes control circuit 110 generating signals 120 and 130, such that a duty cycle of first signal 120 encodes an amplitude of electrical current 170 having a sinusoidal shape (800). In addition, a duty cycle of second signal 130 encodes information, first signal 120 being phase-shifted relative to second signal 130 by a phase shift encoding a phase angle of electrical current 170 (802). Control circuit 110 then delivers signals 120 and 130 to gate driver circuit 140 (804). By encoding the phase angle of electrical current 170 in the phase shift between signals 120 and 130, as comparing to encoding the phase angle in the duty cycle of second signal 130, control circuit 110 can encode other information in the duty cycle of second signal 130. For example, control circuit can encode the frequency, a rate of acceleration, a direction of rotation, and/or commands such as a braking command.

Control circuit 110 may encode the phase angle of electrical current 170 in the phase shift between signals 120 and 130 as a numerical value between one and zero. The phase shift may represent a ratio between the phase angle of electrical current 170 and a predetermined angle value. For example, if the rising edges of signals 120 and 130 are aligned in time, gate driver circuit 140 may determine that the phase angle of electrical current 170 is zero. If the rising edge of second signal 130 is phase-shifted in time from the rising edge of first signal 120 by half of a period of signals 120 and 130, then gate driver circuit 140 may determine that the phase angle of electrical current 170 is equal to half of the predetermined angle value.

The technique of FIG. 8 includes gate driver circuit 140 determining a duty cycle of driver signal 150 as a function of signals 120 and 130 (806). Gate driver circuit 140 can determine the phase shift between signals 120 and 130 using Equation (7). Gate driver circuit 140 can determine the phase angle of electrical current 170 based on the phase shift using Equation (8). Gate driver circuit 140 can then determine the duty cycle of driver signal 150 based on the determined phase angle of electrical current 170 using one of Equations (4a)-(4c) and Equation (5). Gate driver circuit 140 may continually re-determine the duty cycle of driver signal 150 for each new cycle or period of signals 120 and 130. In some examples, gate driver circuit 140 can re-determine the duty cycle of driver signal 150 at a slower rate, such as every two, three, or any number of periods of duty cycle of driver signal 150. Gate driver circuit 140 then delivers driver signal 150 to switch 162 to cause switch 162 to deliver electrical current 170 having the sinusoidal shape to electrical load 180 (808).

Figure 9A:
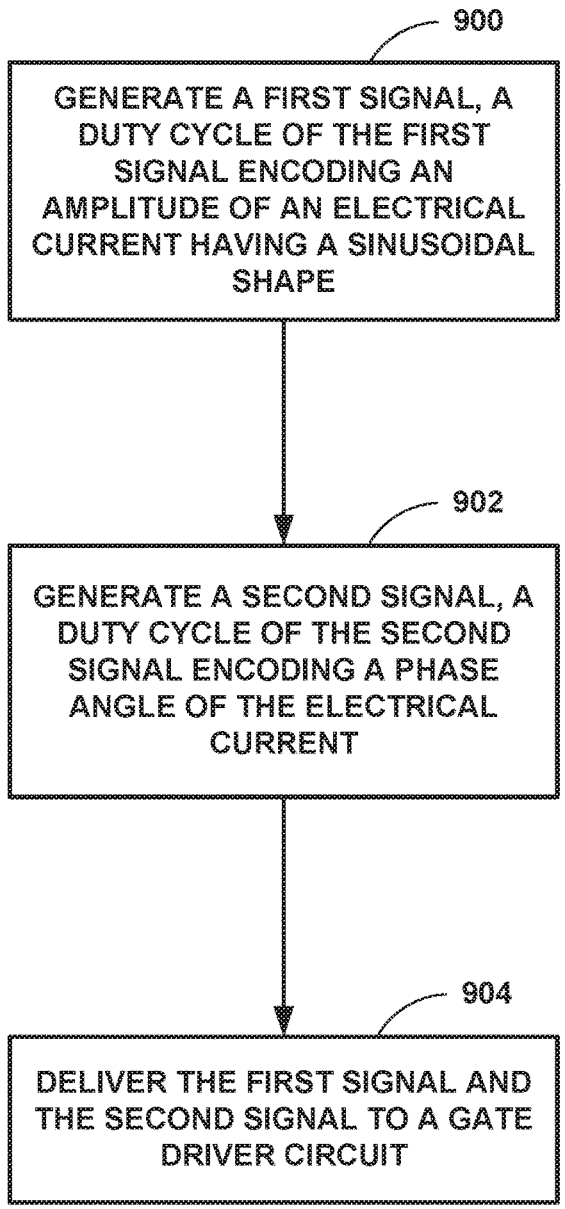
Figure 9B:
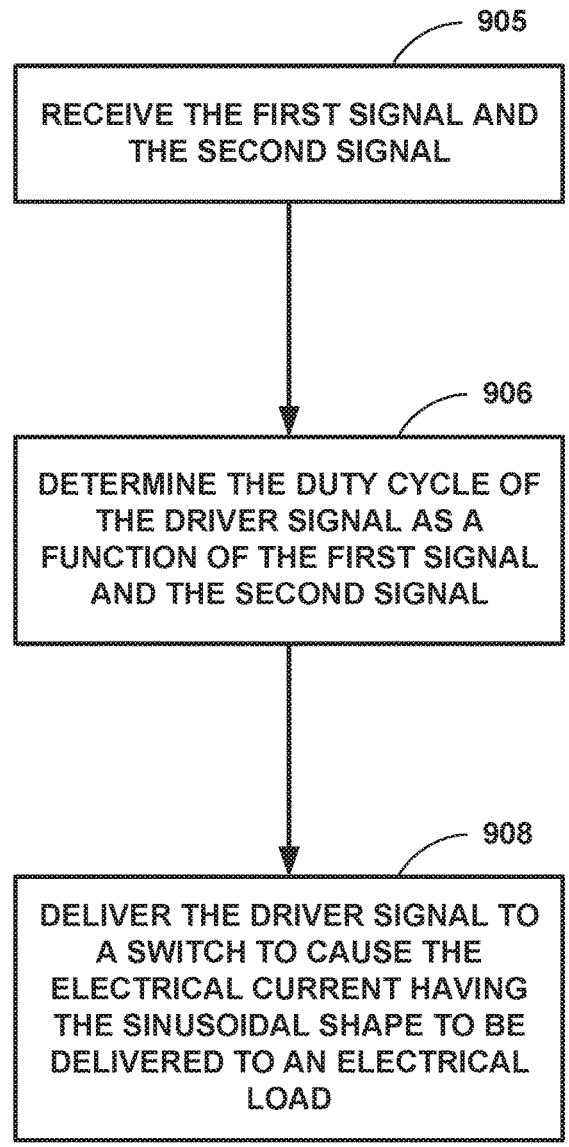

FIGS. 9A and 9B depict the example operations of control circuit 110 and gate driver circuit 140. The technique of FIG. 9A includes control circuit 110 generating first signal 120, where a duty cycle of first signal 120 encodes an amplitude of electrical current 170 having a sinusoidal shape (900). Control circuit 110 can encode the amplitude of electrical current 170 in the duty cycle of signal 120 as a function of a predetermined maximum amplitude using Equation (1). The technique of FIG. 9A also includes control circuit 110 generating second signal 130, where a duty cycle of second signal 130 encodes a phase angle of electrical current 170 (902). Control circuit 110 can encode the phase angle of electrical current 170 as a function of a predetermined angle value using Equation (2). Control circuit 110 then delivers signals 120 and 130 to gate driver circuit 140 (904).

The technique of FIG. 9B includes gate driver circuit 140 receiving signals 120 and 130 (905) and determining a duty cycle of driver signal 150 as a function of signals 120 and 130 (906). Gate driver circuit 140 can determine the duty cycle of driver signal 150 based on the duty cycles of signals 120 and 130 using Equations (3)-(5). The technique of FIG. 9B includes gate driver circuit 140 delivering driver signal 150 to switch 162 to cause switch 162 to deliver electrical current 170 having the sinusoidal shape to electrical load 180 (908).

This disclosure has attributed functionality to control circuits 110 and 210. Control circuits 110 and 210 may include one or more processors, such as processor 214. Control circuits 110 and 210 may include any combination of integrated circuitry, discrete logic circuitry, analog circuitry, such as one or more microprocessors, DSPs, ASICs, or FPGAs. In some examples, control circuits 110 and 210 may include multiple components, such as any combination of one or more microprocessors, one or more DSPs, one or more ASICs, or one or more FPGAs, as well as other discrete or integrated logic circuitry, and/or analog circuitry.

The techniques described in this disclosure may also be embodied or encoded in an article of manufacture including a non-transitory computer-readable storage medium, such as memory 212. Example non-transitory computer-readable storage media may include RAM, ROM, programmable ROM (PROM), erasable programmable ROM (EPROM), electronically erasable programmable ROM (EEPROM), flash memory, a hard disk, a compact disc ROM (CD-ROM), a floppy disk, a cassette, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

The following numbered examples demonstrate one or more aspects of the disclosure.

Example 1

A device includes a gate driver circuit and a control circuit configured to generate a first signal, a duty cycle of the first signal encoding an amplitude of an electrical current having a sinusoidal shape. The control circuit is further configured to generate a second signal, a duty cycle of the second signal encoding a phase angle of the electrical current. The control circuit is configured to deliver the first and second signals to the gate driver circuit, which is configured to determine a duty cycle of a driver signal as a function of the first signal and of the second signal. The gate driver circuit is also configured to deliver the driver signal to a switch to cause the electrical current having the sinusoidal shape to be delivered to an electrical load.

Example 2

The device of example 1, wherein a frequency of the driver signal is encoded as a frequency of the first signal or as a frequency of the second signal.

Example 3

The device of examples 1-2 or any combination thereof, wherein the duty cycle of the first signal is representative of a ratio between the amplitude of the electrical current and a predetermined maximum amplitude.

Example 4

The device of examples 1-3 or any combination thereof, wherein the duty cycle of the second signal is representative of a ratio between the phase angle of the electrical current and a predetermined angle value.

Example 5

The device of example 4, wherein the predetermined angle value is 90 degrees, 180 degrees, or 360 degrees.

Example 6

The device of examples 1-5 or any combination thereof, wherein the gate driver circuit is further configured to determine, based on the duty cycle of the second signal, a factor, wherein a numerical value of the factor is comprised between zero and one. The gate driver circuit is also configured to determine the duty cycle of the driver signal as a result of multiplication of the duty cycle of the first signal and the factor.

Example 7

The device of example 6, wherein the duty cycle of the second signal is representative of a ratio between the phase angle of the electrical current and a predetermined angle value. The gate driver circuit is configured to determine the factor by at least determining the phase angle of the electrical current based on the duty cycle of the second signal and the predetermined angle value and determining, using a trigonometric function or an approximation thereof, the factor as an output of the trigonometric function or the approximation using the phase angle of the electrical current as an input of the trigonometric function or the approximation.

Example 8

The device of examples 1-7 or any combination thereof, wherein the first signal and the second signal have different respective frequencies.

Example 9

The device of examples 1-8 or any combination thereof, wherein the driver signal is a PWM signal, and wherein at least one of the first signal or the second signal has a frequency that is N times a frequency of the PWM signal, where N is an integer greater than or equal to two.

Example 10

The device of examples 1-9 or any combination thereof, wherein the driver signal is a first driver signal of three driver signals that further includes a second driver signal and a third driver signal, the switch is a first switch of a plurality of switches that includes three switches, and the electrical current is a first electrical current of three electrical currents that further includes a second electrical current and a third electrical current. The gate driver circuit is further configured to deliver the three driver signals to the three switches to cause the three switches to deliver three respective electrical currents to the electrical load, each having a sinusoidal shape, the three electrical currents having respective phase angles that are offset one relative to the other by a predetermined amount. The gate driver circuit is also configured to determine respective duty cycles of the three driver signals as a function of the first signal and the second signal.

Example 11

The device of example 10, wherein the gate driver circuit is configured to determine a duty cycle of the second driver signal based on the first signal, on the second signal, and on the respective predetermined amount by which the second electrical current is offset relative to first electrical current. The gate driver circuit is also configured to determine a duty cycle of the third driver signal based on the first signal, on the second signal, and on the respective predetermined amount by which the third electrical current is offset relative to the first electrical current.

Example 12

The device of examples 1-11 or any combination thereof, wherein at least one of the first signal or the second signal encodes side information for the gate driver circuit in addition to the phase angle of the electrical current and the amplitude of the electrical current.

Example 13

The device of example 12, wherein the side information is encoded using a presence or an absence of one or more pulses located in a subinterval of cycles of the at least one of the first signal or the second signal.

Example 14

The device of examples 12-13 or any combination thereof, wherein the first signal is phase-shifted relative to the second signal by a phase shift, and wherein the phase shift encodes the side information for the gate driver circuit.

Example 15

The device of examples 12-14 or any combination thereof, wherein the electrical load includes an electric motor including a rotor, and wherein the side information defines a direction of rotation for the rotor and causes the gate driver circuit to deliver the driver signal to the switch to cause the rotor to rotate in the direction of rotation defined by the side information.

Example 16

A device includes a gate driver circuit and a control circuit configured to generate a first signal, a duty cycle of the first signal encoding an amplitude of an electrical current having a sinusoidal shape. The control circuit is further configured to generate a second signal, a duty cycle of the second signal encoding information. The first signal is phase-shifted relative to the second signal by a phase shift that encodes a phase angle of the electrical current. The control circuit is also configured to deliver the first signal and the second signal to the gate driver circuit. The gate driver circuit is configured to determine a duty cycle of a driver signal as a function of the first signal and of the second signal. The gate driver circuit is further configured to deliver the driver signal to a switch to cause the electrical current having the sinusoidal shape to be delivered to an electrical load.

Example 17

The device of example 16, wherein the phase shift is representative of a ratio between the phase angle of the electrical current and a predetermine angle value.

Example 18A

The device of examples 16-17 or any combination thereof, wherein each cycle of the second signal includes a subinterval, a duty cycle of the subinterval of the second signal encoding the information.

Example 18B

The device of examples 16-17 or any combination thereof, wherein each cycle of the second signal includes a first subinterval, a duty cycle of the first subinterval of the second signal encoding the information, and a second subinterval for defining the phase shift relative to the first signal.

Example 19

A system includes a power conversion circuit including a switch, a gate driver circuit, and a control circuit configured to generate a first signal, a duty cycle of the first signal encoding an amplitude of an electrical current having a sinusoidal shape. The control circuit is further configured to generate a second signal, a duty cycle of the second signal encoding a phase angle of the electrical current. The control circuit is also configured to deliver the first signal and the second signal to the gate driver circuit. The gate driver circuit is configured to determine a duty cycle of a driver signal as a function of the first signal and of the second signal. The gate driver circuit is further configured to deliver the driver signal to the switch to cause the electrical current having the sinusoidal shape to be delivered to an electrical load.

Example 20

The system of example 19, wherein the electrical load includes an electric motor including a rotor, and at least one of the first signal or the second signal encodes a direction of rotation for the rotor in addition to the phase angle of the electrical current and the amplitude of the electrical current. The gate driver circuit is further configured to determine the direction of rotation based on the at least one of the first signal or the second signal. The gate driver circuit is configured to deliver the driver signal to the switch to cause the switch to drive the rotor to rotate in the direction of rotation encoded in the at least one of the first signal or the second signal.

Example 21

The system of examples 19-20 or any combination thereof, wherein a frequency of the driver signal is encoded as a frequency of the first signal, as a function of a frequency of the second signal, or as a function of both the frequency of the first signal and the frequency of the second signal. The gate driver circuit is further configured to determine the frequency of the driver signal as a function of the first signal, of the second signal, or of both the first signal and the second signal.

Example 22

A method includes generating, at a control circuit, a first signal and a second signal, a duty cycle of the first signal encoding an amplitude of an electrical current having a sinusoidal shape, and a duty cycle of the second signal encoding a phase angle of the electrical current. The method further includes delivering, by the control circuit, the first signal and the second signal to a gate driver circuit. The method also includes determining, at the gate driver circuit, a duty cycle of a driver signal as a function of the first signal and of the second signal. The method includes delivering, by the gate driver circuit, the driver signal to a switch to cause the electrical current having the sinusoidal shape to be delivered to an electrical load.

Example 23

The method of example 22, further including determining, at the gate driver circuit, the phase angle of the electrical current based on the duty cycle of the second signal and a predetermined angle value. The method also includes determining, at the gate driver circuit and using a trigonometric function, a factor as an output of the trigonometric function using the phase angle of the electrical current as an input of the trigonometric function, wherein a numerical value of the factor is comprised between zero and one. The method includes determining, at the gate driver circuit, the duty cycle of the driver signal as a result of multiplication of the duty cycle of the first signal and the factor.

Example 24A

A method includes generating, at a control circuit, a first signal and a second signal, a duty cycle of the first signal encoding an amplitude of the electrical current, and a duty cycle of the second signal encoding information, the first signal being phase-shifted relative to the second signal by a phase shift encoding a phase angle of the electrical current. The method further includes delivering, by the control circuit, the first signal and the second signal to a gate driver circuit. The method also includes determining, at the gate driver circuit, a duty cycle of a driver signal as a function of the first signal and of the second signal. The method includes delivering, by the gate driver circuit, the driver signal to a switch to cause the electrical current having the sinusoidal shape to be delivered to an electrical load.

Example 24B

The method of example 24A, a frequency of the driver signal is encoded as a function of a frequency of the first signal, as a function of a frequency of the second signal, or as a function of both the frequency of the first signal and the frequency of the second signal.

Example 25

A control circuit configured to generate a first signal and a second signal and deliver the first signal and the second signal to a gate driver circuit, the gate driver circuit being configured to deliver a driver signal to a switch to cause the switch to deliver an electrical current having a sinusoidal shape to an electrical load. The control circuit is configured to generate the first signal having a duty cycle encoding an amplitude of the electrical current. The control circuit is configured to generate the second signal having a duty cycle encoding a phase angle of the electrical current.

Example 26

A gate driver circuit is configured to receive a first signal and determine an amplitude of an electrical current having a sinusoidal shape based on a duty cycle of the first signal. The gate driver circuit is further configured to receive a second signal and determine a phase angle of the electrical current based on a duty cycle of the second signal. The gate driver circuit is also configured to determine a duty cycle of a driver signal as a function of the first signal and of the second signal. The gate driver circuit is configured to deliver the driver signal to a switch to cause the electrical current having the sinusoidal shape to be delivered to an electrical load.

Example 27

The device of examples 1-15 or any combination thereof, wherein a frequency of the driver signal is encoded as a function of a frequency of the first signal, as a function of a frequency of the second signal, or as a function of both the frequency of the first signal and the frequency of the second signal.

Example 28

A device comprising a gate driver circuit and a control circuit configured to generate a first signal, a duty cycle of the first signal encoding a phase angle of an electrical current having a sinusoidal shape, generate a second signal, a duty cycle of the second signal encoding information, the first signal being phase-shifted relative to the second signal by a phase shift encoding an amplitude of the electrical current, deliver the first signal and the second signal to the gate driver circuit, wherein the gate driver circuit is configured to: determine a duty cycle of a driver signal as a function of the first signal and of the second signal, and deliver the driver signal to a switch to cause the electrical current having the sinusoidal shape to be delivered to an electrical load.

Example 29

The device of example 28, wherein each cycle of the second signal includes a subinterval, a duty cycle of the subinterval of the second signal encoding the information.

Various examples of the disclosure have been described. Any combination of the described systems, operations, or functions is contemplated. These and other examples are within the scope of the following claims.

The invention claimed is:

1. A device comprising:
   a gate driver circuit; and
   a control circuit configured to:
   generate a first signal including a duty cycle equal to a duration of a high pulse of the first signal divided by a duration of a period of the first signal, the duty cycle of the first signal encoding an amplitude of an electrical current having a sinusoidal shape,
   generate a second signal including a duty cycle equal to a duration of a high pulse of the second signal divided by a duration of a period of the second signal, the duty cycle of the second signal encoding a phase angle of the electrical current, and
   deliver the first signal and the second signal to the gate driver circuit, wherein the gate driver circuit is configured to:
   determine a duty cycle of a driver signal as a function of the first signal and of the second signal, and
   deliver the driver signal to a switch to cause the electrical current having the sinusoidal shape to be delivered to an electrical load,
   wherein the driver signal is a pulse-width modulation (PWM) signal,
   wherein at least one of the first signal or the second signal has a frequency that is N times a frequency of the PWM signal, and
   wherein N is an integer greater than or equal to two.

2. The device of claim 1, wherein a frequency of the driver signal is encoded as a function of a frequency of the first signal, as a function of a frequency of the second signal, or as a function of both the frequency of the first signal and the frequency of the second signal.

3. The device of claim 1, wherein the duty cycle of the first signal is representative of a ratio between the amplitude of the electrical current and a predetermined maximum amplitude.

4. The device of claim 1, wherein the duty cycle of the second signal is representative of a ratio between the phase angle of the electrical current and a predetermined angle value.

5. The device of claim 4, wherein the predetermined angle value is 90 degrees, 180 degrees, or 360 degrees.

6. The device of claim of claim 1, wherein the gate driver circuit is further configured to:
   determine, based on the duty cycle of the second signal, a factor, wherein a numerical value of the factor is comprised between zero and one, and
   determine the duty cycle of the driver signal as a result of multiplication of the duty cycle of the first signal and the factor.

7. The device of claim 6,
   wherein the duty cycle of the second signal is representative of a ratio between the phase angle of the electrical current and a predetermined angle value, and
   wherein the gate driver circuit is configured to determine the factor by at least:
   determining the phase angle of the electrical current based on the duty cycle of the second signal and the predetermined angle value, and
   determining, using a trigonometric function or an approximation thereof, the factor as an output of the trigonometric function or the approximation using the phase angle of the electrical current as an input of the trigonometric function or the approximation.

8. The device of claim 1, wherein the first signal and the second signal have different respective frequencies.

9. The device of claim 1,
   wherein the driver signal is a first driver signal of three driver signals that further includes a second driver signal and a third driver signal,
   wherein the switch is a first switch of a plurality of switches that includes three switches,
   wherein the electrical current is a first electrical current of three electrical currents that further includes a second electrical current and a third electrical current, and
   wherein the gate driver circuit is further configured to:
   determine respective duty cycles of the three driver signals as a function of the first signal and the second signal, and
   deliver the three driver signals to the three switches to cause the three switches to deliver three respective electrical currents to the electrical load, each having a sinusoidal shape, the three electrical currents having respective phase angles that are offset one relative to the other by a predetermined amount.

10. The device of claim 9, wherein the gate driver circuit is configured to:
    determine a duty cycle of the second driver signal based on the first signal, on the second signal, and on the respective predetermined amount by which the second electrical current is offset relative to first electrical current, and
    determine a duty cycle of the third driver signal based on the first signal, on the second signal, and on the respective predetermined amount by which the third electrical current is offset relative to the first electrical current.

11. The device of claim 1, wherein at least one of the first signal or the second signal encodes side information for the gate driver circuit in addition to the phase angle of the electrical current and the amplitude of the electrical current.

12. The device of claim 11, wherein the side information is encoded using a presence or an absence of one or more pulses located in a subinterval of cycles of the at least one of the first signal or the second signal.

13. The device of claim 11, wherein the first signal is phase-shifted relative to the second signal by a phase shift, and wherein the phase shift encodes the side information for the gate driver circuit.

14. The device of claim 11, wherein the electrical load includes an electric motor including a rotor, and wherein the side information defines a direction of rotation for the rotor and causes the gate driver circuit to deliver the driver signal to the switch to cause the rotor to rotate in the direction of rotation defined by the side information.

15. A device comprising:
a gate driver circuit; and
a control circuit configured to:
generate a first signal including a duty cycle equal to a duration of a high pulse of the first signal divided by a duration of a period of the first signal, the duty cycle of the first signal encoding an amplitude of an electrical current having a sinusoidal shape,
generate a second signal including a duty cycle equal to a duration of a high pulse of the second signal divided by a duration of a period of the second signal, the duty cycle of the second signal encoding information, the first signal being phase-shifted relative to the second signal by a phase shift encoding a phase angle of the electrical current, and
deliver the first signal and the second signal to the gate driver circuit, wherein the gate driver circuit is configured to:
determine, based on the duty cycle of the second signal, a factor, wherein a numerical value of the factor is comprised between zero and one,
determine a duty cycle of a driver signal as a result of multiplication of the duty cycle of the first signal and the factor, and
deliver the driver signal to a switch to cause the electrical current having the sinusoidal shape to be delivered to an electrical load.

16. The device of claim 15, wherein each cycle of the second signal includes a subinterval, a duty cycle of the subinterval of the second signal encoding the information.

17. A device comprising:
a gate driver circuit; and
a control circuit configured to:
generate a first signal including a duty cycle equal to a duration of a high pulse of the first signal divided by a duration of a period of the first signal, the duty cycle of the first signal encoding a phase angle of an electrical current having a sinusoidal shape,
generate a second signal including a duty cycle equal to a duration of a high pulse of the second signal divided by a duration of a period of the second signal, the duty cycle of the second signal encoding information, the first signal being phase-shifted relative to the second signal by a phase shift encoding an amplitude of the electrical current, and
deliver the first signal and the second signal to the gate driver circuit, wherein the gate driver circuit is configured to:
determine, based on the duty cycle of the second signal, a factor, wherein a numerical value of the factor is comprised between zero and one,
determine a duty cycle of a driver signal as a result of multiplication of the duty cycle of the first signal and the factor, and
deliver the driver signal to a switch to cause the electrical current having the sinusoidal shape to be delivered to an electrical load.

18. The device of claim 17, wherein each cycle of the second signal includes a subinterval, a duty cycle of the subinterval of the second signal encoding the information.

19. A system comprising:
a power conversion circuit including three switches;
a gate driver circuit; and
a control circuit configured to:
generate a first signal including a duty cycle equal to a duration of a high pulse of the first signal divided by a duration of a period of the first signal, the duty cycle of the first signal encoding an amplitude of an electrical current having a sinusoidal shape,
generate a second signal including a duty cycle equal to a duration of a high puke of the second signal divided by a duration of a period of the second signal, the duty cycle of the second signal encoding a phase angle of the electrical current, and
deliver the first signal and the second signal to the gate driver circuit, wherein the gate driver circuit is configured to; determine a duty cycle of a first driver signal as a function of the first signal and of the second signal,
determine a duty cycle of a second driver signal based on the first signal, on the second signal, and on a respective predetermined amount by which the second electrical current is offset relative to first electrical current,
determine a duty cycle of a third driver signal based on the first signal, on the second signal, and on the respective predetermined amount by which the third electrical current is offset relative to the first electrical current, and
deliver the three driver signals to the three switches to cause the three switches to deliver three respective electrical currents to an electrical load, each electrical current of the three electrical current having a sinusoidal shape, the three electrical currents having respective phase angles that are offset one relative to the other by the respective predetermined amount.

20. The system of claim 19,
wherein a frequency of the driver signal is encoded as a function of a frequency of the first signal, as a function of a frequency of the second signal, or as a function of both the frequency of the first signal and the frequency of the second signal, and
wherein the gate driver circuit is further configured to determine the frequency of the driver signal as a function of the first signal, of the second signal, or of both the first signal and the second signal.

21. The system of claim 19, wherein the gate driver circuit is further configured to:
determine, based on the duty cycle of the second signal, a factor, wherein a numerical value of the factor is comprised between zero and one, and
determine the duty cycle of the first driver signal as a result of multiplication of the duty cycle of the first signal and the factor.

\* \* \* \* \*

UNITED STATES PATENT AND TRADEMARK OFFICE
CERTIFICATE OF CORRECTION

PATENT NO. : 10,693,454 B2
APPLICATION NO. : 15/988509
DATED : June 23, 2020
INVENTOR(S) : Giuseppe Bernacchia and David Grant Cox It is certified that error appears in the above-identified patent and that said Letters Patent is hereby corrected as shown below:

In the Claims

Column 21, Claim 17, Line 42: "…a gale driver circuit…" should be --…a gate driver circuit…--

Column 22, Claim 19, Line 18: "…duration of a high puke of…" should be --…duration of a high pulse of…--

Column 22, Claim 19, Line 24: "…configured to;…" should be --…configured to:…--

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*